(12) United States Patent
Lin

(10) Patent No.: US 8,816,385 B2
(45) Date of Patent: Aug. 26, 2014

(54) LIGHT EMITTING DIODE PACKAGE AND METHOD FOR MANUFACTURING THE SAME

(71) Applicant: Advanced Optoelectronic Technology, Inc., Hsinchu Hsien (TW)

(72) Inventor: Hsin-Chiang Lin, Hsinchu (TW)

(73) Assignee: Advanced Optoelectronic Technology, Inc., Hsinchu Hsien (TW)

( * ) Notice: Subject to any disclaimer, the term of this patent is extended or adjusted under 35 U.S.C. 154(b) by 0 days.

(21) Appl. No.: 13/912,185

(22) Filed: Jun. 6, 2013

(65) Prior Publication Data

US 2013/0341652 A1 Dec. 26, 2013

(30) Foreign Application Priority Data

Jun. 25, 2012 (CN) .......................... 2012 1 0210013

(51) Int. Cl.
*H01L 33/62* (2010.01)
*H01L 33/48* (2010.01)

(52) U.S. Cl.
USPC .................. 257/99; 257/E33.066; 438/28

(58) Field of Classification Search
None
See application file for complete search history.

(56) References Cited

U.S. PATENT DOCUMENTS

| 7,855,389 | B2* | 12/2010 | Ishikura et al. | 257/79 |
| 2010/0001306 | A1* | 1/2010 | Park et al. | 257/99 |
| 2011/0241030 | A1* | 10/2011 | Kim | 257/88 |
| 2012/0049237 | A1* | 3/2012 | Hata et al. | 257/99 |
| 2012/0168777 | A1* | 7/2012 | Lai et al. | 257/88 |
| 2012/0273833 | A1* | 11/2012 | Chen | 257/99 |

OTHER PUBLICATIONS

Definition of 'sandwich' downloaded from URL<http://dictionary.reference.com/browse/sandwiching> on Apr. 6, 2014.*

* cited by examiner

*Primary Examiner* — Thomas L Dickey
*Assistant Examiner* — Joseph Schoenholtz
(74) *Attorney, Agent, or Firm* — Novak Druce Connolly Bove + Quigg LLP

(57) ABSTRACT

An exemplary light-emitting diode (LED) package includes a first electrode, a second electrode spaced from the first electrode, an electrically insulating substrate sandwiched by and connecting with the first electrode and the second electrode, a first LED chip and a second LED chip mounted on top surfaces of the first and second electrodes respectively, and a reflector covering the top surfaces of the first and second electrodes. The first LED chip mounted on the top surface of the first electrode is above the second LED chip mounted on the top surface of the second surface. L-shaped retaining walls are formed on the top surfaces of the first and second electrodes. By the retaining walls, the LED package can also be used as a side-view LED package.

20 Claims, 9 Drawing Sheets

LIGHT EMITTING DIODE PACKAGE AND METHOD FOR MANUFACTURING THE SAME

BACKGROUND

1. Technical Field

The present disclosure generally relates to solid state light emitting sources and, more particularly, to a light emitting diode (LED) package and a method for manufacturing the LED package, wherein the LED package has LED chips located at different levels.

2. Description of Related Art

LEDs have many advantages, such as high luminosity, low operational voltage, low power consumption, compatibility with integrated circuits, easy driving, long term reliability, and environmental friendliness which have promoted the wide use of LEDs as a light source.

A typical LED package includes a substrate, a circuit mounted on a top surface of the substrate, a first color LED chip and a second color LED chip electrically connecting the circuit respectively. Light emitted from the first color LED chip and light emitted from the second color LED chip are mixed together to form a resultant light having desired color, such as a white light.

However, because the first color LED chip and the second color LED chip are arranged on one flat surface of the substrate, the first and second color LED chips are in a same plane substantially. As such, a part of light emitted from the first color LED chip will be absorbed by the second color LED chip, resulting in a decrease of a light output efficiency of the LED package.

Therefore, what is needed, is an LED package and a method for manufacturing the LED package which can overcome the limitations described above.

DETAILED DESCRIPTION

Embodiments of the LED package 1 and a method for manufacturing the LED package 1 of the present disclosure will now be described in detail below and with reference to the drawings.

Figure 1:
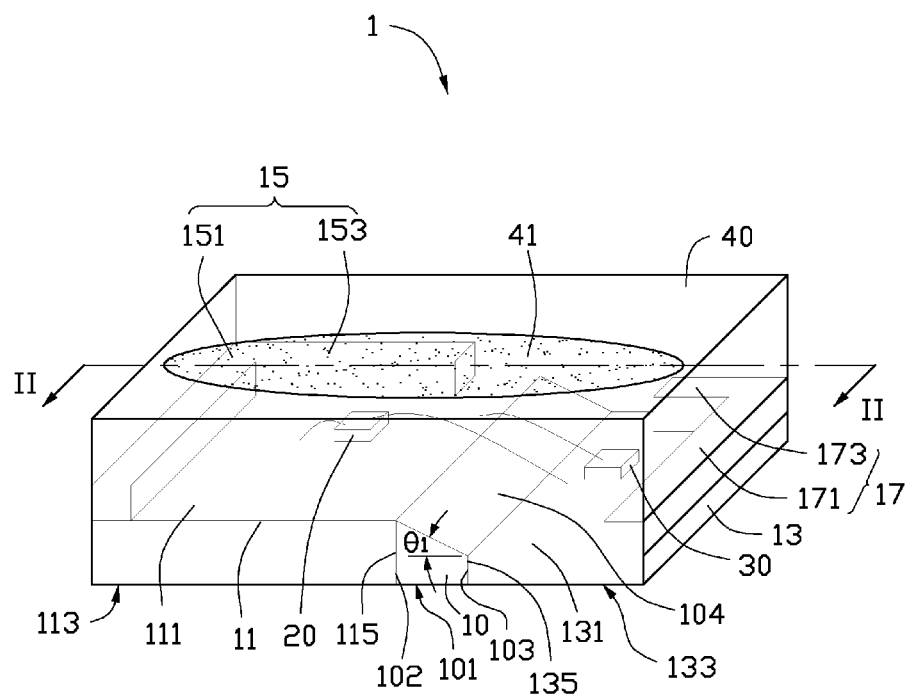
FIG. 1 is a perspective view of an LED package in accordance with an exemplary embodiment of the present disclosure.

Referring to FIG. 1, an LED package 1, in accordance with an exemplary embodiment, is provided. The LED package 1 includes a substrate 10, a first electrode 11 and a second electrode 13 sandwiching the substrate 10 therebetween, a first retaining wall 15 mounted on the first electrode 11, a second retaining wall 17 mounted on the second electrode 13, a first LED chip 20 and a second LED chip 30 electrically connecting the first electrode 11 and the second electrode 13 respectively, and a reflector 40 surrounding the first and second LED chips 20, 30 and covering the first and second retaining walls 15, 17.

The substrate 10, the first electrode 11 and the second electrode 13 are arranged along a longitudinal direction of the LED package 1. A top surface 111 of the first electrode 11 is above a top surface 131 of the second electrode 13. The first LED chip 20 is mounted on the top surface 111 of the first electrode 11, and the second LED chip 30 is mounted on the top surface 131 of the second electrode 13, whereby the first LED chip 20 is located at a level higher than the second LED chip 30.

The substrate 10 is a block made of electrically insulating material. The substrate 10 is elongated, and extends along a transverse direction of the LED package 1.

The substrate 10 includes a bottom surface 101, a first lateral face 102 and a second lateral face 103 extending upwardly from opposite edges of the bottom surface 101 respectively, and a top surface 104 interconnecting the first and second lateral side faces 102, 103. In this embodiment, the first and second lateral faces 102, 103 are perpendicular to the opposite edges of the bottom surface 101 respectively, and the first and second lateral faces 102, 103 extend along the transverse direction of the LED package 1.

The bottom surface 101 of the substrate 10 is a horizontally flat surface. A height of the first lateral face 102 is higher than a height of the second lateral face 103. The top surface 104 is an oblique surface, and is inclined from the top of the first lateral face 102 towards the top of the second lateral face 103.

A first angle θ1 is defined between the bottom surface 101 and the top surface 104 of the substrate 10. The first angle θ1 is varied between 40 degrees to 60 degrees. Preferably, the first angle θ1 is 57.5 degrees.

The first electrode 11 is a rectangular parallelepiped with a uniform height, and the first electrode 11 connects the first lateral face 102 of the substrate 10.

A flat bottom surface 113 of the first electrode 11 is opposite to the top surface 111. The bottom surface 113 is coplanar with the bottom surface 101 of the substrate 10. A side face 115 interconnecting the top and bottom surfaces 111, 113 adjoins the first lateral face 102 of the substrate 10. And a height of the side face 115 equals the height of the first lateral face 102 of the substrate 10. In this embodiment, the side face 115 is extending elongatedly along the transverse direction of the LED package 1.

The second electrode 13 and the first electrode 11 are located at different heights, wherein a height of the second electrode 13 is lower than that of the first electrode 13. The first and second electrodes 11 each have an L-shaped profile and have the same thickness. In detail, the second electrode 13 also includes a flat bottom surface 133 opposite to the top surface 131. The bottom surface 133 is coplanar with the bottom surface 101 of the substrate 10. A side face 135 interconnecting the top and bottom surfaces 131, 133 adjoins the second lateral face 103 of the substrate 10. And a height of the side face 135 equals the height of the second lateral face 103. In this embodiment, the side face 135 extends elongatedly along the transverse direction of the LED package 1.

With the above-described configuration, the top surface 111 of the first electrode 11 is above and parallel to the top surface 131 of the second electrode 13, and the top surfaces 111, 131 of the first and second electrodes 11, 13 connect opposite edges of the top surface 104 of the substrate 10 respectively. As such, the top surface 104 of the substrate 10 is inclined downwardly from the top surface 111 of the first electrode 11 toward the top surface 131 of the second electrode 13.

In this embodiment, a front end face of the substrate 10 is coplanar with front end faces of the first and second electrodes 11, 13, and a rear end face of the substrate 10 is coplanar with rear end faces of the first and second electrodes 11, 13.

The first retaining wall 15 is a metallic sheet, and is L-shaped. The first retaining wall 15 includes a first main body 151, and a first bending part 153 bent from an end of the first main body 151. In this embodiment, the first main body 151 is arranged on a left edge of the top surface 111 of the first electrode 11. The first bending part 153 is bent rightward from the rear end of the first main body 151, and is arranged on the rear edge of the top surface 111. Front and rear ends of the first main body 151 are respectively coplanar with the front end and the rear end of the first electrode 11. An outer face of the first main body 151 is coplanar with the corresponding left end surface of the first electrode 11. An outer face of the bending part 153 is coplanar with the corresponding rear end face of the first electrode 11. Alternatively, the first retaining wall 15 can be integrally formed with the first electrode 11 as a monolithic piece.

Similarly to the first retaining wall 15, the second retaining wall 17 is also a metallic sheet, and is L-shaped. In detail, the second retaining wall 17 includes a second main body 171, and a second bending part 173 bent from an end of the second main body 171. In this embodiment, the second main body 171 is parallel to the first main body 151, and is extending along the right edge of the top surface 131 of the second electrode 13. The second bending part 173 is bent leftward from the rear end of the second main body 171, and is aligned with the first bending part 153. The second bending part 173 is also arranged along the rear edge of the top surface 131 of the second electrode 13. The second bending part 173 is shorter than the first bending part 153.

Front and rear end faces of the second main body 171 are coplanar with the front and rear end faces of the second electrode 13 respectively. An outer face of the second main body 171 is coplanar with the corresponding right end face of the second electrode 13, and an outer face of the second bending part 173 is coplanar with the corresponding rear end face of the second electrode 13. Alternatively, the second retaining wall 17 can be integrally formed with the second electrode 13 as a monolithic piece.

The first LED chip 20 emits a first color light, and the second LED chip 30 emits a second color light. In this embodiment, the first LED chip 20 is a blue LED chip, and the second LED chip 30 is a red LED chip. Alternatively, the location of the first and second LED chips 20, 30 can be exchanged.

The reflector 40 is rectangular-shaped, and covers the first and second retaining walls 15, 17, and portions of the first and second electrodes 11, 13 and the substrate 10 and surrounds the first and second LED chips 20, 30.

In this embodiment, a front end face of the reflector 40 is coplanar with the front end faces of the first and second electrodes 11, 13, and the substrate 10. A rear end face of the reflector 40 is coplanar with the rear end faces of the first and second electrodes 11, 13, and outer faces of the first and second bending parts 153, 173 and the rear end face of the substrate 10.

The front end faces of the first and second main body 151, 171, and the front end faces of the substrate 10, the first electrode 11 and the second electrode 13 are exposed to ambient air. The rear side faces of the first and second electrodes 11, 13, and the outer faces of the first and second bending parts 153, 173 are exposed out to ambient air. Preferably, outer faces of the first and second main bodies 151, 171 are also exposed out to ambient air.

Figure 2:
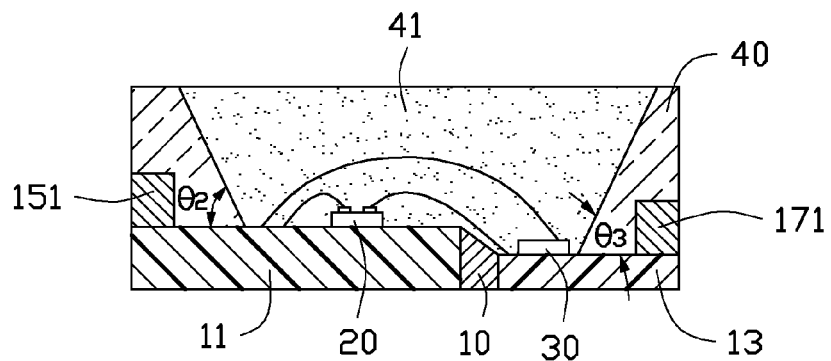
FIG. 2 is a cross-sectional view of the LED package of FIG. 1, taken along II-II line.

Also referring to FIG. 2, a cavity 41 is defined in a central portion of the reflector 40. The cavity 40 is surrounded by an annular inner surface of the reflector 40. The annular inner surface tapers downwardly. Part of the inner surface is inclined from a top surface of the reflector 40 to the top surface of the first electrode 11; another part of the inner surface is inclined from the top of the reflector 40 to the top surface of the second electrode 13.

A second angle $\theta 2$ is defined between the top surface 111 of the first electrode 11 and the inner surface of the reflector 40 defining the cavity 41 and extending to the top surface 111 of the first electrode 11. The second angle $\theta 2$ is varied between 40 degrees to 60 degrees. Preferably, the second angle $\theta 2$ is 57.5 degrees. Similarly, a third angle $\theta 3$ is defined between the top surface 131 of the second electrode 13 and the inner surface of the reflector 40 defining the cavity 41 and extending to the top surface of the second electrode 13. The third angle $\theta 3$ is varied between 40 degrees to 60 degrees. Preferably, the third angle $\theta 3$ is 57.5 degrees.

Figure 3:
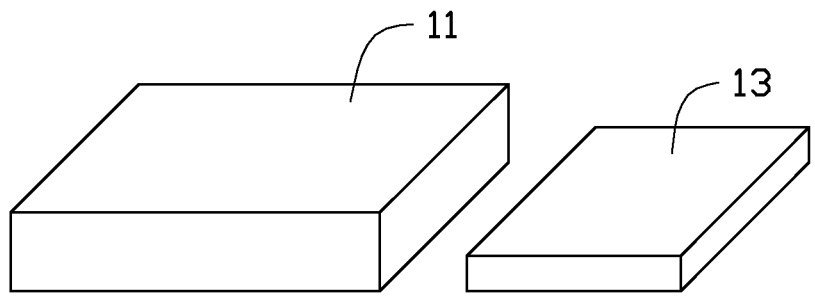
FIGS. 3-9 are schematic views showing the steps of a method for manufacturing the LED package of FIG. 1.

The present disclosure further provides a method for manufacturing the LED package 1 of FIG. 1. The method includes following steps:

Referring to FIG. 3, the first step is providing a first electrode 11 and a second electrode 13. In this embodiment, the first electrode 11 is a cuboid-shaped plate with a uniform height. The second electrode 13 is similar to the first electrode 11, but the height of the second electrode 13 is lower than the height of the first electrode 11.

Figure 4:
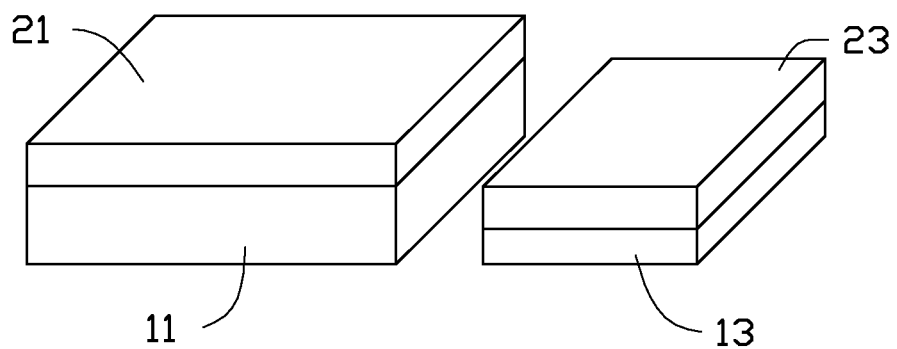

Referring to FIG. 4, the second step is coating a first metallic plate 21 and a second metallic plate 23 on top surfaces of the first and second electrodes 11, 13, respectively to form the first retaining wall 15 and the second retaining wall 17. In this embodiment, the first and second metallic plates 21, 23 each have a similar shape with a corresponding one of the first and second electrodes 11, 13. Side faces of the first metallic plates 21 are coplanar with the corresponding side faces of the first electrode 11, and side faces of the second metallic plates 23 are coplanar with the corresponding side faces of second electrode 13. Alternatively, the first and second retaining walls 15, 17 can be formed by electroplating metallic material on top surfaces 111, 131 of the first and second electrodes 11, 13 respectively.

Figure 5:
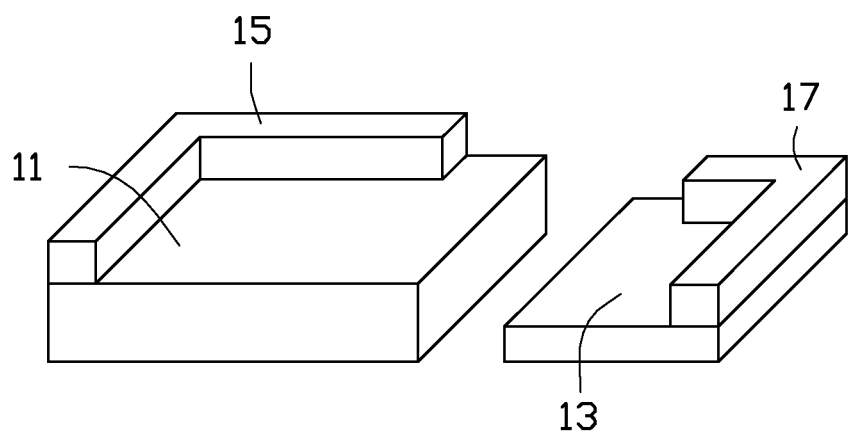

Referring to FIG. 5, the third step is etching the first metallic plate 21 to form the first retaining wall 15, and etching the second metallic plate 23 to form the second retaining wall 17.

Figure 6:
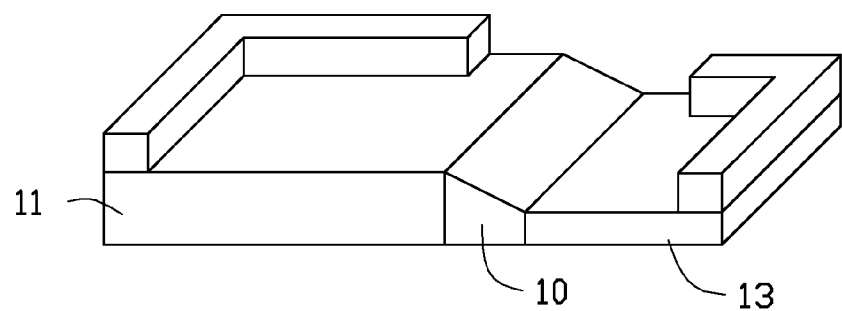

Referring to FIG. 6, the fourth step is providing a substrate 20, and sandwiching and connecting the substrate 20 between the first electrode 11 and the second electrode 13. In this embodiment, the first lateral face 102 of the substrate 10 adjoins the side face 115 of the first electrode 11; the second lateral face 103 of the substrate 10 adjoins the side face 135 of the second electrode 13.

Figure 7:
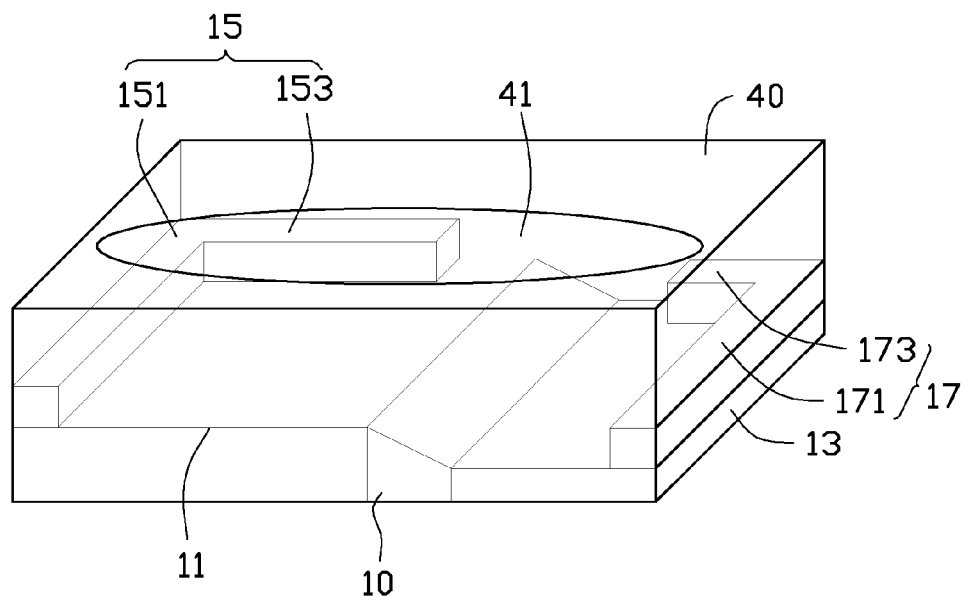

Referring to FIG. 7, the fifth step is forming the reflector 40 to cover top surfaces of the first and second electrodes 11, 13 and the first and second retaining walls 15, 17. In this embodiment, a cavity 41 is defined in a central portion of the reflector 40. Outer faces of the first and second retaining walls 15, 17 are exposed out to ambient air.

Figure 8:
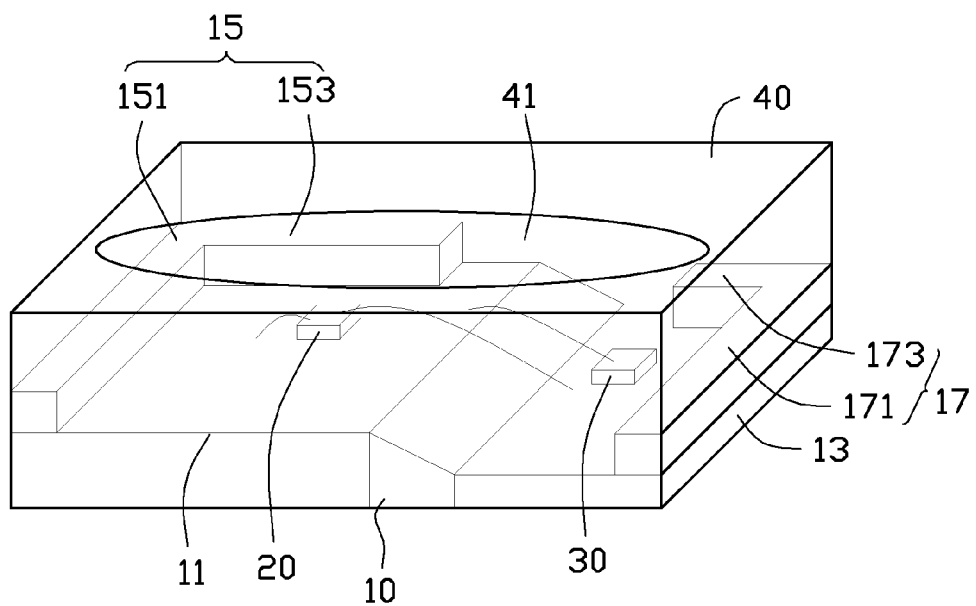

Referring to FIG. 8, the sixth step is providing a first LED chip 20 and a second LED chip 30, and electrically connecting the first and second LED chips 20, 30 to the first and second electrodes 11, 13 respectively. In this embodiment, the first LED chip 20 is a blue LED chip, and is located on the top surface of the first electrode 11; the second LED chip 30 is a red LED chip, and is located on the top surface of the second electrode 13. The first LED chip 20 is glued to the top surface of the first electrode 11 and electrically connected to the first and second electrodes 11, 13 by two conductive wires, for example, gold wires. The second LED chip 30 is soldered on the top surface of the second electrode 13. Alternatively, the second LED chip 30 may be a Zener diode to protect the first LED chip 20 from being damaged by a electrostatic interference.

Figure 9:
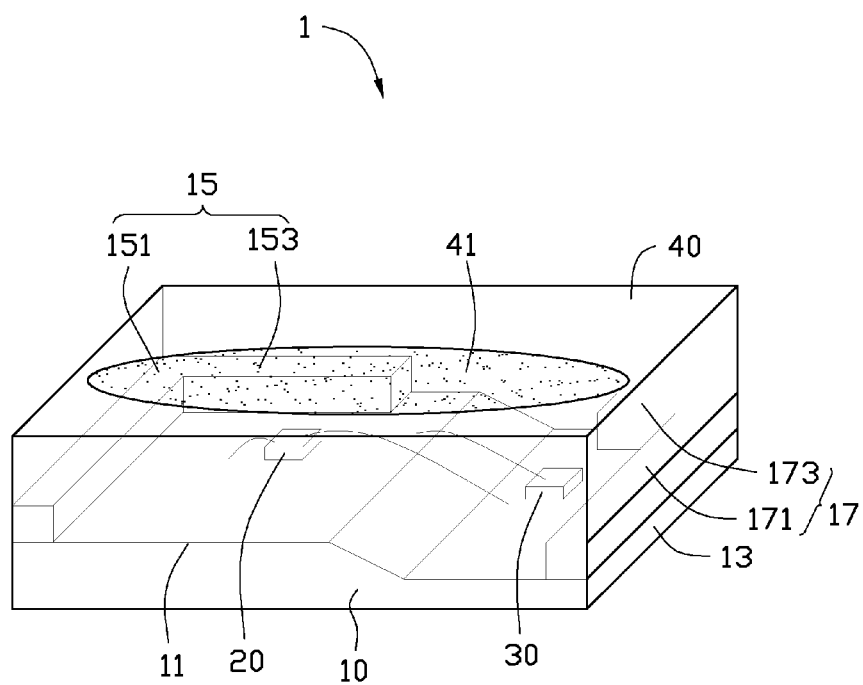

Referring to FIG. 9, the seventh step is forming a luminescent layer 50 in the cavity 41 to cover the first and second LED chips 20, 30 to form an individual LED package 1.

According to the LED package 1 of the present disclosure, because the first LED chip 20 on the top surface of the first electrode 11 is above the second LED chip 30 on the top surface of the second electrode 13, less light emitted from the first LED chip 20 will be absorbed by the second LED chip 30, whereby more light can be mixed to emit out of the reflector 40. As such, the light output efficiency of the LED package 1 is increased.

In addition, when mounting the LED package 1 to a printed circuit board (not shown), because the rear side faces of the first and second retaining walls 15, 17 are exposed out to ambient air, and are coplanar with the rear side faces of the first and second electrodes 13, 15 respectively, the contact area of the LED package 1 with the printed circuit board is increased. This maintains that the LED package 1 can be more firmly mounted on the printed circuit board by a horizontal orientation, wherein the cavity 41 is opened to an aspect parallel to the extending direction of the printed circuit board. Accordingly, the LED package 1 in accordance with the present disclosure can also be used as a side-view LED package. Also, because outer faces of the first main body 151 of the first retaining walls 15 and outer faces of the second main body 171 of the second retaining walls 17 are exposed out to ambient air, heat-dissipating efficiency of the LED package 1 is increased, whereby a lifespan of the LED package 1 is extended.

It is to be understood that the above-described embodiments are intended to illustrate rather than limit the disclosure. Variations may be made to the embodiments without departing from the spirit of the disclosure as claimed. The above-described embodiments illustrate the scope of the disclosure but do not restrict the scope of the disclosure.

What is claimed is:

1. A light emitting diode (LED) package comprising:
    an electrically insulating substrate;
    a first electrode and a second electrode sandwiching and connected to the substrate; and
    a first LED chip and a second LED chip electrically connecting the first and second electrodes respectively, a height of the first electrode being larger than a height of the second electrode, and the first LED chip mounted on a top surface of the first electrode being above the second LED chip mounted on a top surface of the second electrode.

2. The LED package of claim 1, wherein the substrate comprises a flat bottom surface, a first lateral face and a second lateral face extending upwardly from opposite edges of the bottom surface respectively, a top surface interconnecting the first and second lateral faces of the substrate, a side face of the first electrode adjoining the first lateral face of the substrate, a side face of the second electrode adjoining the second lateral face of the substrate, the top surface declining downwardly from the first lateral face toward the second lateral face.

3. The LED package of claim 2, wherein a height of the first electrode equals a height of the first lateral face of the substrate, and a height of the second electrode equals a height of the second lateral face of the substrate.

4. The LED package of claim 3, wherein the top surface of substrate connects top surfaces of the first and second electrode, and the top surface is declined downwardly from the top surface of the first electrode to the top surface of the second electrode.

5. The LED package of claim 4, wherein a first angle defined between the bottom surface of the substrate and the inclined top surface of the substrate is varied from 40 degrees to 60 degrees.

6. The LED package of claim 5, wherein the first angle is 57.5 degrees.

7. The LED package of claim 1, wherein a first retaining wall is arranged on the top surface of the first electrode, the first retaining wall is extending along edges of the first electrode, a second retaining wall is arranged on the top surface of the second electrode, the second retaining wall is extending along edges of the second electrode, outer faces of the first and second retaining walls being coplanar with corresponding end faces of the first and second electrodes.

8. The LED package of claim 7, wherein the first retaining wall is L-shaped and comprises a first main body and a first bending part bent from an end of the first main body, the second retaining wall is also L-shaped and comprises a second main body and a second bending part bent from an end of the second retaining wall, the first and second bending parts are in a same side of the LED package, and the first and second main bodies are parallel to each other.

9. The LED package of claim 8, wherein outer faces of the first and second main body are coplanar with corresponding end faces of the first and second electrode respectively and outer faces of the first and second bending parts are coplanar with corresponding end faces of the first and second electrode respectively.

10. The LED package of claim 9, wherein the first retaining wall is integrally formed with the first electrode as a monolithic piece, and the second retaining wall is integrally formed with the second electrode as a monolithic piece.

11. The LED package of claim 9, wherein a reflector is formed on the first and second electrodes, and the reflector covers portions of the top surfaces of the first and second electrodes and the first and second retaining walls therein, and surrounds the first and second LED chips.

12. The LED package of claim 11, wherein outer faces of the first and second bending parts are exposed out to ambient air.

13. The LED package of claim 12, wherein outer faces of the first and second main body are exposed out to ambient air.

14. The LED package of claim 13, wherein a cavity is defined in a central portion of the reflector, an inner surface of the reflector defining the cavity is inclined from the top surface of the reflector to the top surfaces of the first and second electrodes, and a second angle defined between the top surface of the first electrode and the inner surface of the reflector defining the cavity and extending to the top surface of the first electrode equals a third angle defined between the top surface of the second electrode and the inner surface of the reflector defining the cavity and extending to the top surface of the second electrode.

15. The LED package of claim 14, wherein the second angle is varied from 40 degrees to 60 degrees.

16. The LED package of claim 15, wherein the second angle is 57.5 degrees.

17. The LED package of claim 1, wherein the top surface of the first electrode is parallel to the top surface of the second electrode.

18. A method for manufacturing a light emitting diode (LED) package comprising following steps:
    S1: providing a first electrode and a second electrode, a height of the first electrode being higher than a height of the second electrode;

S2: coating a first metallic plate and a second metallic plate on top surfaces of the first and second electrode respectively;

S3: etching the first metallic plate to form a first retaining wall, and etching the second metallic plate to form a second retaining wall;

S4: providing an electrically insulating substrate, sandwiching and connecting the substrate between the first electrode and the second electrode; and S5: providing a first LED chip and a second LED chip, connecting the first and second LED chips electrically to the first and second electrodes respectively, wherein the first and second LED chips are respectively located on the first and second electrodes, and wherein the second LED chip is located at a level lower than that of the first LED chip.

19. The method of claim 18, further comprising a step S6 of forming a reflector on the first and second electrode after step S5.

20. The method of claim 19, wherein each of the first and second retaining walls has an L-shaped profile with a bending part, the bending parts extending toward each other and being aligned with each other, outer sides of the bending parts being coplanar with corresponding sides of the first and second electrodes, the outer sides of the bending parts and the corresponding sides of the first and second electrodes being exposed to ambient air.

\* \* \* \* \*